United States Patent

Pammer et al.

[15] 3,642,545

[45] Feb. 15, 1972

[54] METHOD OF PRODUCING GALLIUM DIFFUSED REGIONS IN SEMICONDUCTOR CRYSTALS

[72] Inventors: Erich Pammer; Horst Panholzer, both of Munich, Germany

[73] Assignee: Siemens Aktiengesellschaft, Berlin, Germany

[22] Filed: Apr. 13, 1970

[21] Appl. No.: 27,751

[30] Foreign Application Priority Data

Apr. 17, 1969 Germany ......................P 19 19 563.2

[52] U.S. Cl. ............................148/187, 117/106 D, 156/17

[51] Int. Cl. ......................................C23c 11/08, H01l 7/50

[58] Field of Search .................148/187; 117/106 D; 156/17; 252/448 B; 23/165 B

[56] References Cited

UNITED STATES PATENTS

| | | | |
|---|---|---|---|
| 2,972,555 | 2/1961 | Deutscher | 117/107 D |
| 2,989,421 | 6/1961 | Novak | 117/107 D |
| 3,009,841 | 11/1961 | Faust, Jr. | 147/187 X |
| 3,326,729 | 6/1967 | Sigles | 148/187 X |
| 3,341,381 | 9/1967 | Bergman et al. | 148/187 |
| 3,410,710 | 11/1968 | Mochel | 117/107 D X |
| 3,503,813 | 3/1970 | Yamamoto | 148/187 |

*Primary Examiner*—Allen B. Curtis

*Attorney*—Curt M. Avery, Arthur E. Wilfond, Herbert L. Lerner and Daniel J. Tick

[57] ABSTRACT

Process for the production of *p*-doped zones in semiconductor crystals through diffusion of gallium using the planar technique. The process comprises: Forming an aluminum oxide masking layer on the semiconductor crystal surface through the pyrolytic precipitation from an aluminum and oxygen containing organic compound. Producing windows in the aluminum oxide layer using the photoetch technique, with phosphoric acid etchant. Indiffusing gallium into the semiconductor crystal and removing the aluminum oxide masking layer by hot phosphoric acid.

9 Claims, 2 Drawing Figures

PATENTED FEB 15 1972 3,642,545

METHOD OF PRODUCING GALLIUM DIFFUSED REGIONS IN SEMICONDUCTOR CRYSTALS

Figure 1:
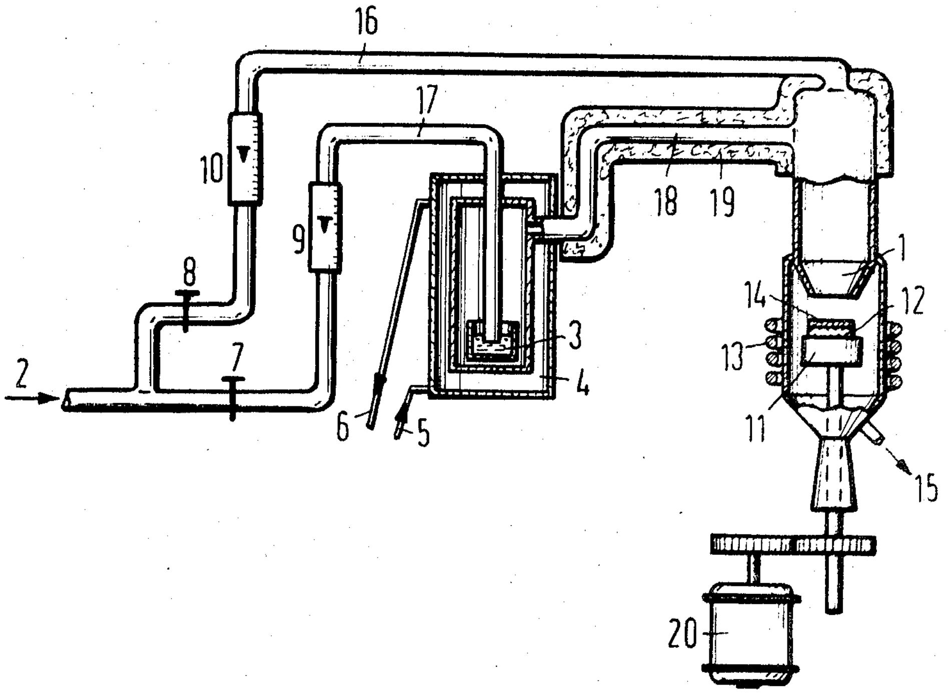

Our invention relates to a method for producing p-coated regions in semiconductor crystals, by diffusion, with gallium as the dopant, using the method steps, known from the planar technique.

To produce semiconductor components, where a crystal wafer must be provided with several locally separated regions of the surface zone, of variable conductance type and very low layer thickness, for the mode of operation of the component, it is necessary to employ the method steps of planar technique. To produce locally limited regions in a surface layer, it is customary to provide the surface with a protective layer which masks the dopant and to expose through photoetching only that region wherein the coated zone is to be developed. Such protective layers are for example $SiO_2$, $Si_3N_4$, and Sic.

Gallium is one of the most important dopants, next only to boron for the production of p-doped regions in silicon or germanium crystals.

Masking layers of $SiO_2$ are unsuitable when gallium is used as a dopant, which is particularly important for producing semiconductor components whose original material is germanium since they are permeable to gallium. One possibility for improving the masking properties is to install phosphoruspentoxide $(p_2)_5)$ into the $SiO_2$. In this case, however, at the temperatures required for gallium diffusion, the outdiffusion of phosphorus from the $SiO_2$ layer into the substrate must be expected. This leads to an undesirable counter-doping.

The method of our invention eliminates these disadvantages by first of all placing upon the semiconductor crystal surface, a masking layer consisting of aluminum oxide. This aluminum oxide layer is formed on the semiconductor crystal surface through pyrolytic dissociation of an organic compound containing aluminum and oxygen. The surface region in the aluminum oxide layer, which is applied over the total area intended for diffusion is using the photoetching method, by employing phosphoric acid. Gallium is diffused into the semiconductor crystal. Finally, the masking layer comprising aluminum oxide, is removed with a hot solution of phosphoric acid.

It is within the framework of the invention, to use aluminum isopropylate, $Al((CH_3)_2CHO)_3$, as the organic compound, containing aluminum and oxygen.

It is just as possible, however, to use secondary aluminum butylate, $Al(CH_3CH_2CH\ CH_3O)_3$, or aluminum acetylacetonate $Al(CH_3CO\ CH = CO\ CH_3)_3$, for the pyrolytic dissociation.

The use of pyrolytically produced aluminum oxide according to the invention, insures an impeccable gallium masking, without a simultaneous penetration of undesirable foreign substances. The masking effect of aluminum oxide for gallium is based on the fact that the binding intervals and conditions of $Al_2O_3$ and $Ga_2O_3$, are very similar due to the close chemical relationship of the basic elements (the adjacent positions in the Periodic System). The gallium is retained by a lattice installation into the $Al_2O_3$ and thus prevented from diffusing.

Figure 2:
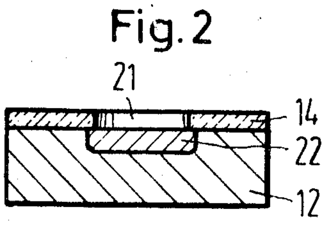

Further details of the method according to the invention are disclosed with reference to an embodiment, making reference to the drawing in which:

FIG. 1 described a device for pyrolytic precipitation of the amorphic masking layer, comprising $Al_2O_3$; and FIG. 2 shows in section, a semiconductor device which can be produced through the method of the present invention.

The reaction chamber 1, comprising a quartz tube, wherein the organic compound containing aluminum and oxygen is kept, is shown in FIG. 1. With nitrogen or argon as the carrier gas (indicated by arrow 2), aluminum isopropylate is blown from the evaporation vessel 3, which is connected through a thermostat 4, to a heating cycle (shown by arrows 5 and 6), and kept at a temperature of 130° C. The gases enter the reaction chamber 1, via flow meters 9 and 10, when the valves 7 and 8 are open, and are heated inductively on a substrate wafer 12, to 350° to 500° C. An amorphous layer 14 of $Al_2O_3$, which is used as a masking layer during the production of a semiconductor component (see FIG. 2) forms on substrate wafer 12, comprising a germanium crystal, which for example, is prepared by chemical grinding. The residual gases leave the reaction chamber 1 at the outlet indicated with arrow 15.

For pyrolysis, a flow rate of 4 liters/min. is adjusted in line 16 which extends parallel to the evaporation vessel 3, for the nitrogen carrier gas, while the flow velocity in supply line 17, above the evaporation vessel is kept at 0.3 liters/min. Other flow conditions effect a change in grow rate and layer thickness profile. A heating bandage or insulating jacket 19 is arranged around the supply line 18, which leads to the reaction chamber 1 and contains the organic compound which effects dissociation. This heating bandage 19 insures that the compound does not deposit at the cold pipe lines. The temperature of the heating bandage 19 is set at 130° C. An additional motor 20 which rotates the susceptor 11, affords a good heat distribution at the substrate wafer 12.

FIG. 2 shows a germanium crystal wafer 12 of n-conducting type, applied according to the method of the invention, comprising $Al_2O_3$ and provided with a masking layer 14. The masking layer 14 has a window 21 etched into it, by means of known method steps of the photoetching method and concentrated phosphoric acid $(H_3PO_4)$ is heated to 70° C. A p-doped region 22 is produced into the thus exposed crystal surface, by gallium indiffusion as the dopant.

After the indiffusion is carried out, the remaining masking layer 14, must be dissolved. This is done with concentrated phosphoric acid, heated to 150° C. In order to facilitate a better adjustment in subsequent working steps, the indiffused structures (region 22 in FIG. 2) can previously be made visible by etching, for example when using germanium with hydrogen peroxide $H_2O_2$. Further processing of the diffused crystals is effected according to the known methods.

The present invention is not limited to the use of masking layers of $Al_2O_3$ on germanium crystals, particularly used for twice-diffused germanium high-frequency transistors, but can also be used for the manufacture of silicon semiconductor components.

Moreover, a possibility exists to precipitate such masking layers also upon semiconductor crystals comprising $A^{III}B^{V}$ compounds, whereby the protective layer is defined by the $Al_2O_3$ masking layer, so as to prevent the outdiffusion of the volatile component from the respective components.

We claim:

1. A process for the production of p-doped zones in semiconductor crystals through diffusion of gallium using the planar technique which comprises first forming an aluminum oxide masking layer on the semiconductor crystal surface through the pyrolytic precipitation from an aluminum and oxygen containing organic compound, producing windows in the aluminum oxide layer, using the photoetch technique, with phosphoric acid as the etchant, and indiffusing gallium into the semiconductor crystal, and finally removing the aluminum oxide masking layer by means of hot phosphoric acid.

2. The process of claim 1, wherein aluminum isopropylate is used as the organic compound containing aluminum and oxygen.

3. The process of claim 1, wherein secondary aluminum butylate is used as the organic compound containing aluminum and oxygen.

4. The process of claim 1, wherein aluminum acetylacetonate is used as the organic compound containing aluminum and oxygen.

5. The process of claim 1, wherein the photoetching is carried out using concentrated phosphoric acid heated to about 70° C.

6. The process of claim 1, wherein the aluminum oxide masking layer is removed by phosphoric acid heated to 150° C.

7. The process of claim 1, wherein nitrogen or argon is used for the carrier gas for the pyrolysis of the aluminum and oxygen containing compound, with a flow velocity of about 4 liters/minute in a flow line to the reaction chamber and about 0.3 liters/minute in a parallel flow line passing through the aluminum and oxygen containing compound on its way to the reaction chamber.

8. The process of claim 1, wherein the carrier gas with the organic compound is at 130° C. and the precipitation of the organic compound occurs at 350° to 400° C. when germanium is used as the crystal.

9. The process of claim 1 wherein the crystal is germanium.

* * * * *